US005909014A

United States Patent [19]

Mengel

[11] Patent Number: 5,909,014

[45] Date of Patent: Jun. 1, 1999

[54] LOW FREQUENCY EQUAPHASE SURROUND LOUDSPEAKER

[76] Inventor: Clare Louis Mengel, 750 Lily Flagg Rd., Huntsville, Ala. 35802

[21] Appl. No.: 08/227,301

[22] Filed: Apr. 13, 1994

Related U.S. Application Data

[63] Continuation of application No. 08/077,319, Jun. 15, 1993, abandoned, which is a continuation of application No. 07/751,736, Aug. 29, 1991, abandoned.

[51] Int. Cl.[6] .............................. H05K 5/00; G10K 13/00

[52] U.S. Cl. ........................... 181/146; 181/151; 181/166

[58] Field of Search ..................................... 181/146, 151, 181/166

[56] References Cited

U.S. PATENT DOCUMENTS

| | | | |
|---|---|---|---|
| 2,067,582 | 1/1937 | Sperling | 181/175 |
| 3,155,774 | 11/1964 | Howell | 181/166 |
| 3,187,832 | 6/1965 | Broadley | 181/166 |
| 3,735,336 | 5/1973 | Long | 181/176 |
| 4,161,995 | 7/1979 | Pohlmann et al. | 181/150 |
| 4,256,198 | 3/1981 | Kawakami et al. | 181/141 |
| 4,387,787 | 6/1983 | King | 181/155 |

*Primary Examiner*—Eddie C. Lee
*Attorney, Agent, or Firm*—Steven P. Shurtz; Brinks Hofer Gilson & Lione

[57] ABSTRACT

Shown, in the application, is a novel and extremely cost effective method to replace traditional and contemporary baffles and enclosures used for preventing the cancellation and consequent radiation of lower frequencies from loudspeakers. The space occupied for the added beam element to accomplish this task is smaller than the loudspeaker itself and adds little to the overall size of the loudspeaker system. With this simple element, baffle size, bidirectional, equaphase reproduction down to and including the fundamental loudspeaker resonance, is obtained.

10 Claims, 2 Drawing Sheets

LOW FREQUENCY EQUAPHASE SURROUND LOUDSPEAKER

Figure 1:
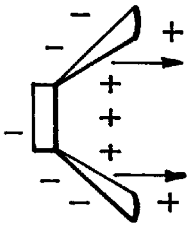

This application is a continuation of application Ser. No. 08/077,319, filed on Jun. 15, 1993, which is a continuation of prior application Ser. No. 07/751,736, filed on Aug. 29, 1991, both now abandoned.

BACKGROUND OF INVENTION

1. Field of Invention

The herein described invention deals with a revolutionary new method which provides a conventional voice coil driven piston loudspeaker with the ability to reproduce acoustical low frequencies without the conventional baffle or box enclosure air motion cancellation methods and their attendant disadvantages. Many patents and descriptive literature exist giving rise to methods which perform the functions of a simple large flat sheet. This is the basic conventional baffle used in loudspeaker reproduction to prevent the air motion short circuit and the reproduction of low frequency waves. These methods, mostly enclosures, take a variety of names, such as infinite baffle and vented enclosures, to prevent the passage of the above moved air from reaching the other side of the speaker before a half wavelength at the lowest frequency to be reproduced has transpired. Some speaker systems take the twelve to eighteen decibels loss because of the cancellation, and use multiple speakers and higher powered amplifiers and call them planar or bi-directional speaker systems. Nothing could be more wasteful or further from the truth. They lack ingenuity and inventiveness. In the first place, the above last specifically mentioned system is not equaphase because one side of the loudspeaker is positive and the other negative. So many methods and variations on all of the above methods exist that this application would be overwhelmed if they were all enumerated . As one will see later, my invention is much more profound, original and totally more useful. At any rate, none were found in a search which are applicable as prior art or even close to the herein described invention.

The herein described method does not use the commonly described above devices to alleviate the cancellation of the air motion. Described herein is a revolutionary method of inverting the phase of one side of the piston radiator so that the radiation from one side of the system is one hundred and eighty degrees out of its normal cone phase from the piston loudspeaker. This means that cancellation cannot occur since the air moved by the system is either going away from both sides of the loudspeaker at the same time or going towards the loudspeaker system simultaneously. This means that both sides of the piston loudspeaker are radiating in a phase which adds to the total acoustical radiation and with near double power. This results in a true equaphase radiation pattern, with approximately twice the radiating power.

2. Description of Prior Art

As mentioned above, there is an enormous amount of prior art in attempting to overcome the above described problem. No method similar or close to the herein described concept has been uncovered.

DESCRIPTION OF THE INVENTION

A piston loudspeaker has an unusual advantage over other acoustical radiators such as so called planer, ribbon, electrostatic and other such loudspeakers. When a piston radiating loudspeaker's total reactive components, namely mass and compliance, are chosen so that the loudspeaker's mass is predominant above a chosen frequency, then the radiation from that piston loudspeaker is approximately constant down to that chosen resonant frequency, namely, where the compliance and the mass are equal. This is because the cone's total excursion is inversely proportional to frequency when the loudspeaker is mass controlled. That is, as the excitation frequency is lowered, the excursion increases to make the air moved by the loudspeaker constant or, as in audiophile lingo, flat. Radiation is also effective, if there is a way to prevent the above-mentioned cancellation from occurring, such as a large flat plane, commonly called a baffle, or a totally enclosed large volume, called a cabinet. Another widely used method, when the cabinet is to be made smaller than the infinite box, is the Helhmholtz resonator or many wide variations of such.

Another acoustical radiator, discussed very infrequently, is a vibrating string, such as a harp string. There is no requirement for a baffle since the various parts, and the air moved by the various parts of the vibrating string, are not in phase, with each other as is the case for a piston loudspeaker. In a piston loudspeaker, all parts of the piston move as one coherent device, neglecting high power "break-up".

The origin of this herein described concept had its beginning attempting to use the vibrating string principal in combination with a parasitic radiating diaphragm. Visualize a piston loudspeaker so that another diaphragm was able to be stretched or mounted in the front of the loudspeaker at the speaker's usual mounting edges. This will enclose the air within a very small volume consisting of outside the cone and the diaphragm whose edges are rigidly attached to the boundary edges of the loudspeaker. When the loudspeaker is excited, the cone is free to move and compresses the air in the enclosed boundary causing the parasitic diaphragm to stretch and vibrate in phase with the cone. However, the parasitic diaphragm radiates secondarily in a pattern similar to that of vibrating string inasmuch as the center of this parasitic radiator moves largely and the edges of the diaphragm cannot move. Therefore, there is a gradual increase in parasitic diaphragm movement from zero at the edge to maximum in the center of the parasitic diaphragm, but at no time is there a corresponding piston type phase relationship, except in the exact center of the diaphragm and the driving piston cone. This simple concept was, while fulfilling the inventor's ideas, unacceptable for several reasons. The most important reason being, that there was a resonance between the enclosed air space similar to box enclosures of all types. However, it did work as visualized, even though crudely. Loudspeaker resonance was increased similarly to an enclosure method, which was unacceptable. No commonly known thin film, light weight materials tried, overcame this problem.

The inventor continued his search for a unique diaphragm which would not have the problems attendant with a stretched film. A revolutionary breakthrough became possible when the inventor remembered from school and other experiments Bernoulli's Theorem.

Described in simple form: "The principle that the total energy per unit of mass in the streamline flow of a moving fluid is constant, being the sum of the potential energy, the kinetic energy, and the energy due to pressure. The faster the fluid flow, the less the pressure, and vice versa." Fluid in the herein described invention is air. Some scientists equate this theorem in practice to the Venturi Effect. It is, however not exact. If one takes two pieces of paper and holds them between his thumb and forefinger and tries to blow the two pieces of paper apart, he will find that instead of the two pieces of paper being separated, the two pieces of paper try to stick together. Another observation is when two trains pass each other on different tracks going in opposite directions, one would think that the air caused by the trains movement would want to separate the trains, but it turns out the opposite is true. The two trains want to pull towards each other. as though a vacuum is formed between the trains. Aerodynamics use this principal in the design of wings for lifting airplanes. The inventor will use Bernoulli's principal to make a parasitic diaphragm having very unusual and beneficial features, which will allow the above described ideas about the mylar film experiments viable where the mylar film was not.

When one takes a one inch piece of ordinary, medium density, open cell polyurethane foam, and places this over his ears, and listens to audio from a source, he will notice little or no attenuation from this piece of foam when placed over either ear when the listener is three or more feet from the audio radiating source. It is virtually transparent. Further, if one takes a half inch thick piece of this same material and tries to blow through the piece of polyurethane foam, he will find that a steady state type of blow will not move the piece of polyurethane foam held between the two hands. If one were to pulsate the blowing he would find there is a movement of the piece of polyurethane foam from the pulsation. What is happening? The medium density open cell polyurethane foam is made up of capillary type fissures running between the front and back of the piece of foam. Constant blowing, no rate of change, will allow the air to move fairly freely through the polyurethane foam. However, when a large volume of air, in the form of pulse, is applied as before, through the polyurethane foam, the capillary fissures want to be drawn together and close off the foam and the foam becomes stiff enough to become an efficient radiating diaphragm. This simple light weight, very flexible, elastic insert material, can become very stiff when attempting to pass large volumes of air through the material in a cyclic manner as encountered with audio frequencies. As large a volume of air can be moved as can be moved with a loudspeaker cone from this simple, normally very flexible medium.

When the properties of a piece of one inch thick open cell polyurethane foam, cut to the size of the outside edge of, for instance, a twelve inch (12") piston loudspeaker, and foam diaphragm is attached rigidly to the edges of an ordinary piston type loudspeaker, the foam diaphragm will become energized by the piston or cone's own air movement and will move the parasitic diaphragm opposite to the movement of the energizing loudspeaker cone. Extraordinary! This polyurethane foam parasitic diaphragm can take a variety of mounting methods which will be covered later under the Drawing Section. Other advantages pertain: (a) at rest there is no enclosed volume of air since the foam parasitic diaphragm is transparent to low movement or static air; (b) the mass of the parasitic diaphragm is comparable to the diving cone's mass; (c) there is no change in the resonant frequency of the system over and above the free air resonance of the driving loudspeaker; (d) there is increase in efficiency over a plain baffle since the movement of the polyurethane foam parasitic diaphragm is in non-canceling phase with the energy radiating from the rear of the driving cone, thus adding to it instead of canceling it.

DESCRIPTION OF INVENTION USING DRAWINGS

Described, using drawings, one will see how extraordinary and novel this invention accomplishes a feat searched for over many years by acoustic scientists, audiophiles and experimenters alike. The description will begin in a very elementary fashion, the knowledge known to all those skilled in the art. The description culminates in an explanation of the operating features of this extraordinary speaker system not known by any one skilled in the art, until now.

Beginning with page No. 1

FIG. 1 which shows a loudspeaker representation when energized or moving, by a motor, not shown. Notice the polarities and the arrow directions indicating that the piston or diaphragm is moving in a certain direction. All piston type loudspeakers perform in a like manner.

Figure 2:
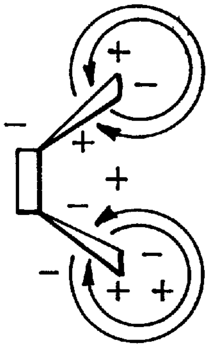

FIG. 2 shows the classical problem with an unbaffled piston type loudspeaker, very clearly showing the short circuit which occurs when no baffle or other rigid contraption is placed between the plus and the minus, corresponding to pressure increases and partial vacuums or decreased pressures. The increases in pressure want to run around and fill the vacuum created by the cone movement. This phenomenon results in a cone movement with no audible sound at distances from the cone larger than the diameter of the piston cone. In other words, at low frequencies, and one listens even at fairly short distance from the piston, the sound is very weak. This phenomenon exists even though the cone is moving and air is being moved. One can get very close, much less than a half wavelength, and hear the low frequency sound, but as one retreats away from the piston, the sound disappears. By now, it is obvious something is needed to overcome this problem.

Figure 3:
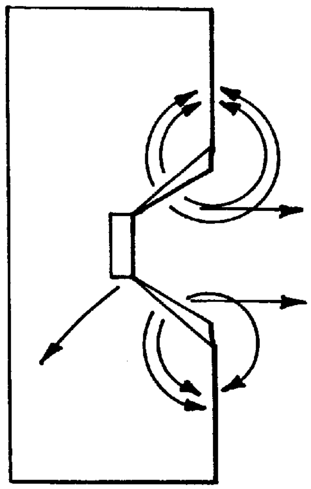

FIG. 3 shows a simple box which nullifies the short circuit and allows low frequencies to be reproduced. This box, while preventing the cancellation, introduces other problems associated with a volume of air, which is now compressed and decompressed, much like a spring. Other problems, such as the mass of the operating piston assembly, interact and can cause resonances at certain sizes and frequencies corresponding to the various reactive values. The compressed air being a compliance and corresponding to a capacitance in electrical analogue. The mass of the piston is similar to an inductance in the same electrical analogue.

Figure 4:
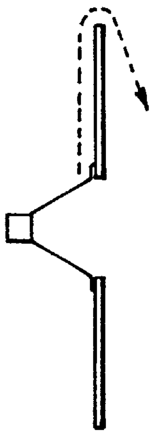

FIG. 4 shows a simple rigid sheet of material placed between the rear of the piston and the front of the piston, so that the air must take a longer path, with consequent longer time so that by the time the air mass arrives to either side of the piston it is not in a phase to cancel. This is a very effective method and suffers minor problems, such as the baffle sheet being very large at usable low frequencies, approximately ten feet across at one hundred cycles. The exact dimensions are governed by theory and are dependent on the propagation time in air at the user's altitude, temperature and other air related parameters. The above example of one hundred cycles is close enough to demonstrate the one large problem associated with this remedy for the above discussed short circuit problem. One other attendant problem is that the energy radiated is usually wasted because in ordinary homes, the room size is usually comparable to the necessary baffle size and only one side of the air movement is able to be appreciated.

Figure 5:
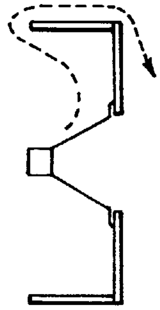

FIG. 5 shows an open box or the beginning of a tube which can also mitigate the air movement to avoid cancellation. Resonance will occur at certain air path lengths. As the depth of the tube becomes longer, a transmission line resonance comes into play, which can be useful, but annoying depending on the design of the tube. This resonance is similar to that which occurs at radio frequencies. One quarter wave length path lengths will provide large volumes of air at the open end and present high impedances to the piston. This phenomenon, well known to those skilled in the art, is fluently being used contemporarily. One other method, not shown, which uses combined cabinet and loudspeaker reactance parameters to obtain resonance. This well know Helmholtz resonator is being used even more so. It is believed enough examples are discussed which show contemporary methods used today to overcome the above described cancellation problem.

Figure 6:
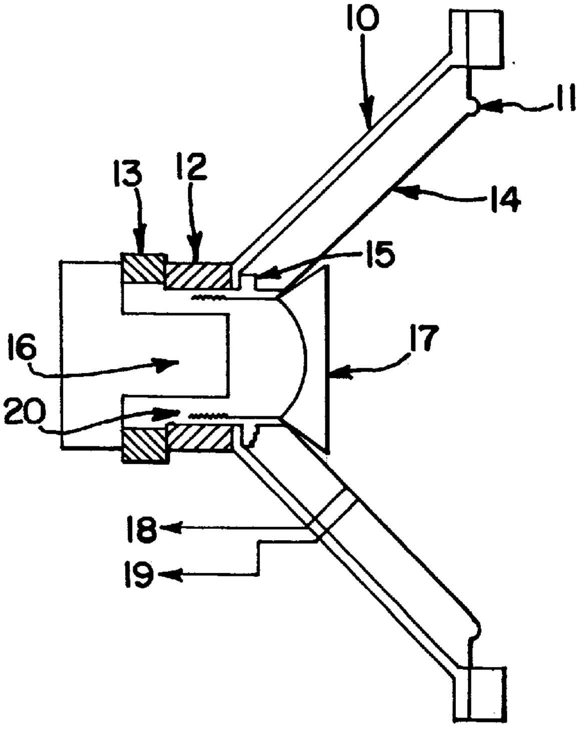

FIG. 6 shows a modern representation of a modern dynamic, piston type loudspeaker. These loudspeakers have been in use for some sixty years or so. There are many different variations to this basic design and there are associated patents on the many variations. However, the basic design, shown on FIG. 6 is very representative of all dynamic loudspeakers in use today. No. 10 indicates the frame or basket of the loudspeaker; No. 11 shows the suspension surround, sometimes called the annulus; No. 12, front pole piece; No. 13, the magnet; No. 14, the cone, diaphragm, or piston; No. 15, the inner suspension; No 16, the center or rear pole piece; No. 17, the dust cap covering the voice coil assembly; No. 18 and No. 19, the voice coil wires for connection to a suitable amplifier; No. 20, the voice coil. The voice coil and magnet assembly combine to form the motor which moves No. 14, the piston, which moves the air in piston-like fashion. Its motion is in and out with no tilt or wobble allowable. All parts of the cone are in phase and move as a unit. Note, it is not a vibrating string phenomenon. Breakup of the cone occurs at sometime and is a detriment and one of the limiting power handling items of the particular designed loudspeaker. However, in most well designed loudspeakers, this occurs at high excursions when moving large quantities of air. The cone, No. 14, represents the largest part of the moving mass, inductance is the electrical analogue. The inner suspension, No. 15, and the outer suspension, annulus, represent the compliance of the loudspeaker, capacitance in the electrical analogue. Together these parameters will resonate at some low frequency. At this resonate point, the loudspeaker will be most efficient and will be the lower limit of the loudspeakers realistic capability. Below this point the compliance predominates as opposed to the mass which predominates above this resonate frequency. From the resonate frequency up in the lower frequency range the loudspeaker is what is called “mass controlled”, and as one excites the loudspeaker with decreasing frequencies, the excursion automatically increases so that the acoustical radiation, theoretically, is constant down to and above the mentioned resonant point. When the compliance takes over, the loudspeaker acoustical radiation falls off very rapidly. The loudspeaker without a baffle exhibits these pure characteristics, even though there may not be any acoustical radiation because of the lack of baffle. As mentioned above, all box type of baffle enclosures interact with the reactances of the loudspeaker. Looking at page No. 2, the heart or core of the invention will be described. All numbers of the parts of the previously described loudspeaker pertain.

Figure 7:
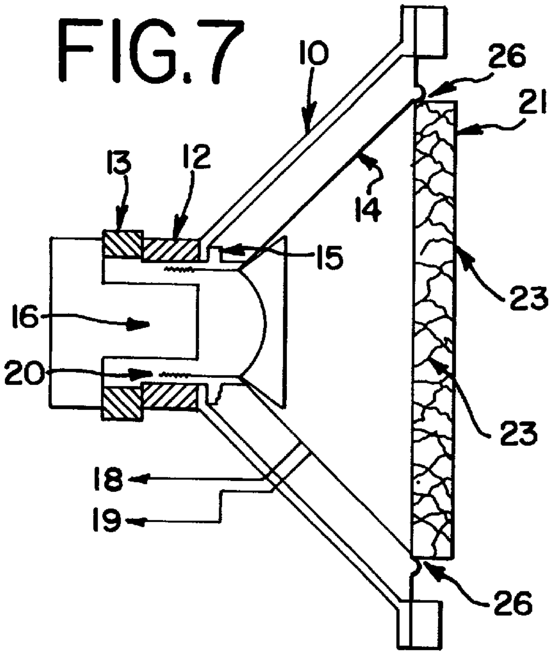

What has been added to the candidate loudspeaker in FIG. 7 has been No. 21. This points to a one inch thick piece of open all medium density polyurethane foam. The edges, No. 26, of the parasitic diaphragm is attached to the cone directly by silicone cement and is carried back and forth by the cyclic motion of the cone. As mentioned earlier, this is the same candidate twelve inch diameter speaker. Let us excite the loudspeaker with, for example, thirty cycles. The motor drives the cone, all points of the cone surface move in phase forward as shown by the arrow labeled “AM”, which stands for air motion. The parasitic diaphragm is carried with the cone and intercepts air. This air penetrates the open air cells, capillaries, No. 23, causing them to contract according to Bernoulli’s Theorem. Stretching occurs of the medium between the capillaries because of the capillary bound elastic boundaries. Now the capillaries become smaller in diameter, causing a constriction to the energy which, in turn is translated into the movement of the parasitic polyurethane foam diaphragm. The time taken by this phenomenon is one hundred and eighty degrees (180 degrees). This means that the parasitic diaphragm is moving opposite to the excitation piston phase, and opposite to the phase of the radiation behind the cone. Thus cancellation can not take place since the radiation from the front parasitic diaphragm is opposite the radiation, air movement from the rear of the cone. The time for energizing the polyurethane foam cells is not frequency sensitive, and easily goes down to the lowest frequencies to be reproduced, for example, twenty cycles. The polyurethane foam does not break-up or physically distort at any power level which can be applied to the driving loudspeaker. The foam in its act ion does not modify the unbaffled or original loudspeaker parameters. The properties are almost unbelievable. All of the above can be proven and demonstrated by experiment. Since there in no change in the acoustical properties of the driving loudspeaker, no coloration is evident in the acoustical radiation, such as would be from all practical sized types of enclosures. The acoustical sound is more like that of the largest flat baffle or the largest box enclosure, except there is in phase radiation from both sides of the loudspeaker. This sound is like no other that the inventor has ever heard. It seemingly fills the room with bass, low frequencies.

Figure 8:
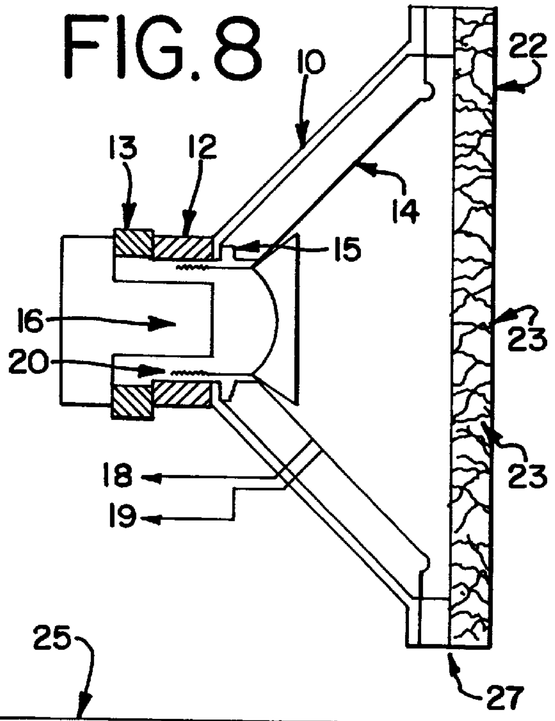

FIG. 8 shows a different method of exciting the parasitic diaphragm. Note that the polyurethane foam parasitic diaphragm, No. 21, is attached, No. 26, to the frame edges of the loudspeaker and is not carried by the cone movement. In this case the cone’s air movement can freely move through the diaphragm. The air interacts with the capillary cells and exactly the same results occur as describe previously. The two different examples are shown to clearly illustrate the flexibility of the system.

Figure 9:
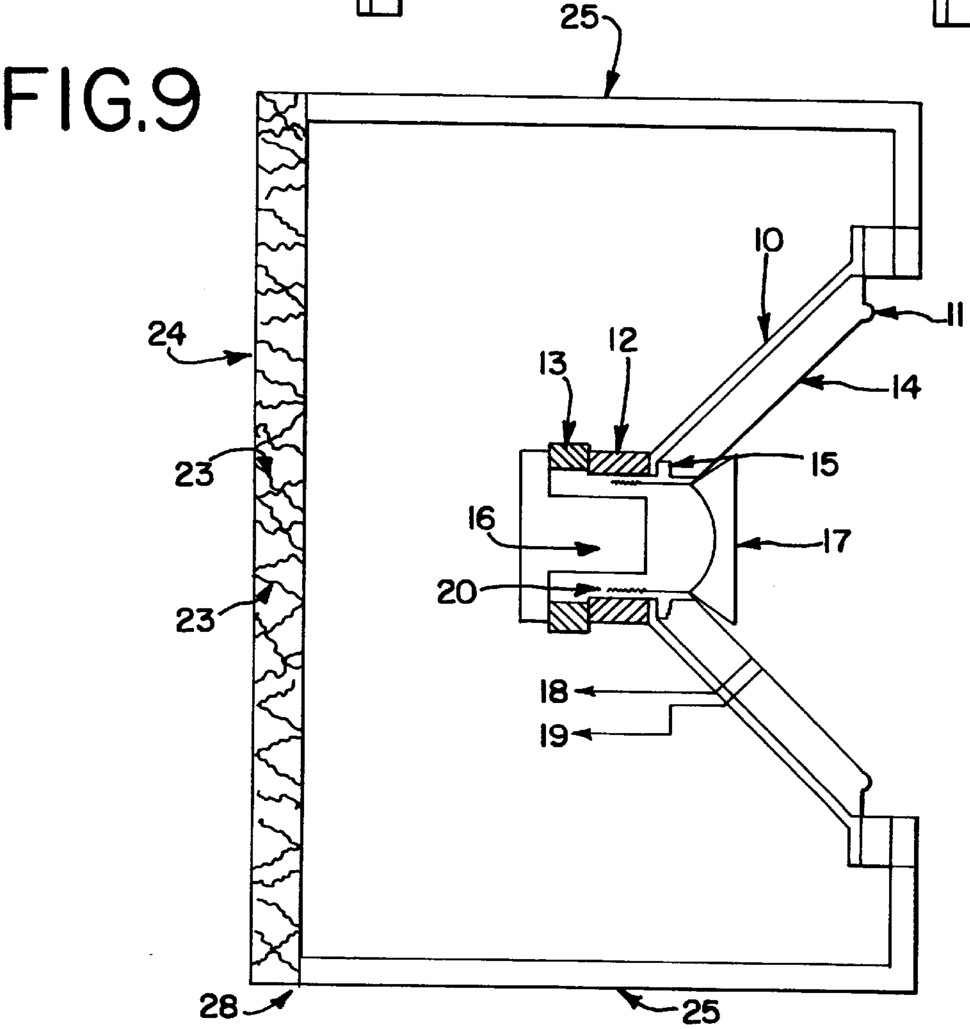

Page No. 3, FIG. 9 shows another method of causing the above phenomenon to occur using a slightly different method of polyurethane foam diaphragm excitation. The same representative loudspeaker is used. The loudspeaker is enclosed in an entrainment housing, the smallest enclosure volume that will accommodate the loudspeaker. No. 25 points to the enclosure which fortunately does not require the ordinary thick wood panels or stiffness since the air movement within the enclosure is spent moving the parasitic diaphragm. The foam diaphragm, No. 24, is energized similar to that described in FIGS. No. 7 and 8 except slightly more volume of air is compressed and decompressed to excite the parasitic diaphragm, No. 24. and, of course, it uses the rear of the piston’s air motion. Similar acoustical results are obtained using this arrangement. The difference in performance due to the slightly increased amount of air moved would have to be measured with better instruments than the inventor has at his disposal. It is not noticeable by listening experiment. The notation “AM”, air motion, shows the simultaneous movement of the diaphragm and the cone. The obvious advantage is that the driving loudspeaker is uninhibited in the front. However, when the parasitic diaphragm is not stiffened by the above explained process and consequently not performing as radiating element, the higher frequencies pass through unaffected, the polyurethane foam parasitic diaphragm is virtually transparent at these frequencies.

CONCLUSIONS

Shown has been a novel and totally effective way of preventing the cancellation which occurs in unbaffled loudspeakers at low frequencies, an almost impossible feat, at least until now. The advantages are diminutive size, practically no larger than the parent loudspeaker. Genuine equaphase, bi-directionality, plus and plus to minus and minus on both sides of the system during entire cycle of electrical energizing. It is economical to manufacture. Not the least, no noticeable affect on the mechanical and electrical parameters measured under the traditional unbaffled conditions, such as; the basic fundamental resonance staying the same using the parasitic diaphragm as it was without it.

I claim:

1. A method for avoiding short circuit cancellation of acoustical energy from opposite sides of a low frequency piston loudspeaker, the method comprising the steps of:

a) providing a low frequency piston loudspeaker with the piston being in a cone shape supported by a frame, the loudspeaker having a diameter of at least twelve inches, the cone having a front side and a rear side activatable for acoustically moving air;

b) attaching planar open cell foam having a uniform cross section and comprising randomly oriented contractible cells either directly to the front side of the cone or to the frame in front of the cone to enclose a volume of air between the front side of the piston loudspeaker and the open cell foam such that the open cell foam is energizable responsive to activation of the piston loudspeaker;

c) activating the piston loudspeaker at a low frequency such that all points of the cone surface move in phase to acoustically move air towards the open cell foam;

d) engaging the foam with the acoustically moved air such that the contractible cells contract and the foam becomes elastically stiff, and thereby energizing the foam with the acoustically moved air such that the foam acoustically radiates one hundred and eighty degrees out of phase with respect to the front side of the piston loudspeaker and in phase with respect to the rear side of the same piston loudspeaker to thereby avoid short circuit cancellation of acoustical energy.

2. A process for avoiding short circuit cancellation during the generation of low frequency acoustical energy comprising the steps of:

a) providing a loudspeaker having a front and rear, the loudspeaker comprising a frame with an outer edge and a piston supported at the frame edge, the piston having a front side and a rear side;

b) providing a piece of ordinary open cell foam;

c) attaching said foam to said loudspeaker, either directly or indirectly, with an air-tight attachment to create an operative portion of said foam, the air tight attachment substantially preventing air displaced by movement of said piston from passing between the operative portion of the foam and the piston, the operative portion of the foam being generally planar and having a substantially uniform cross section, the foam being flexible and said attachment allowing the operative portion of the foam to vibrate parasitically with respect to the loudspeaker; and d) activating the loudspeaker so that the piston moves in a piston-like fashion with all parts of the piston moving in phase so as to produce low frequency acoustical energy, the movement of said piston resulting in the impingement of air on the operative portion of said open cell foam, causing said open cells to contract, resulting in the operative portion of the foam radiating acoustical energy that is substantially 180° out of phase from acoustical energy radiated toward the foam by said piston.

3. The process of claim 2 wherein the piston is in the shape of a cone and the step of attaching the foam comprises attaching the edges of the foam to the front side of the piston within said cone such that the foam moves with the piston, thereby directly attaching the foam to the loudspeaker, and wherein the air impinging on the operative portion of the foam is air opposite the foam from the front side of the piston.

4. The process of claim 2 wherein the step of attaching the foam comprises attaching the foam to the outer edge of the frame at the front side of the piston, thereby directly attaching the foam to the loudspeaker, and wherein the air impinging on the operative portion of the foam is air confined between the front side of the piston and the foam.

5. The process of claim 2 wherein the rear of the loudspeaker and frame are enclosed in an entrainment housing and the step of attaching the foam comprises attaching the foam to the housing at the rear side of the piston, thereby indirectly attaching the foam to the loudspeaker, and wherein the air impinging on the operative portion of the foam is air confined in said housing between the rear side of the piston and the foam.

6. The process of claim 2 wherein the ordinary open cell foam comprises medium density, polyurethane foam.

7. The process of claim 2 wherein the loudspeaker has a diameter of at least about 12 inches.

8. The process of claim 2 wherein the operative portion of the foam is about one inch thick.

9. The process of claim 2 wherein the foam is attached to the loudspeaker with silicon cement.

10. The process of claim 2 wherein the step of activating the loudspeaker comprises activating the loudspeaker to produce acoustical energy of 300 Hertz or less.

* * * * *